(12) United States Patent
Kubode et al.

(10) Patent No.: US 11,685,137 B2
(45) Date of Patent: Jun. 27, 2023

(54) ANISOTROPIC CONDUCTIVE FILM AND CONNECTION STRUCTURE

(71) Applicant: DEXERIALS CORPORATION, Tokyo (JP)

(72) Inventors: Hiromi Kubode, Tokyo (JP); Yasushi Akutsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/765,439

(22) PCT Filed: Oct. 6, 2016

(86) PCT No.: PCT/JP2016/079781
§ 371 (c)(1),
(2) Date: Apr. 2, 2018

(87) PCT Pub. No.: WO2017/061539
PCT Pub. Date: Apr. 13, 2017

(65) Prior Publication Data
US 2018/0287273 A1    Oct. 4, 2018

(30) Foreign Application Priority Data
Oct. 7, 2015  (JP) .................. 2015-199602

(51) Int. Cl.
*H01R 11/01* (2006.01)
*H05K 1/14* (2006.01)
(Continued)

(52) U.S. Cl.
CPC ............. *B32B 5/142* (2013.01); *B32B 27/20* (2013.01); *C08K 9/02* (2013.01); *C08K 2201/001* (2013.01); *Y10T 428/25* (2015.01)

(58) Field of Classification Search
CPC .... C09J 7/10; C09J 2201/36; C09J 2203/326; C09J 2463/00; C08K 9/02;
(Continued)

(56) References Cited

U.S. PATENT DOCUMENTS

| | | |
|---|---|---|
| 2006/0154078 A1 | 7/2006 | Watanabe et al. |
| 2010/0239764 A1* | 9/2010 | Ichizawa ............ B30B 5/04 427/336 |
| 2016/0168428 A1 | 6/2016 | Shinohara |

FOREIGN PATENT DOCUMENTS

| | | |
|---|---|---|
| JP | S64-59786 A | 3/1989 |
| JP | H09-293414 A | 11/1997 |

(Continued)

OTHER PUBLICATIONS

Feb. 12, 2019 Korean Office Action issued in Korean Patent Application No. 10-2018-7007372.
(Continued)

*Primary Examiner* — Cheng Yuan Huang
(74) *Attorney, Agent, or Firm* — Oliff PLC

(57) ABSTRACT

An anisotropic conductive film which suppresses occurrence of short circuit at the time of anisotropic conductive connection, prevents reduction in capturing capability of electrically conductive particles, enables favorable pushing of electrically conductive particles and exhibits not only favorable initial conductivity but also favorable conduction reliability, contains a first electrically conductive particle group and a second electrically conductive particle group, each including a plurality of electrically conductive particles, in an insulating binder. The first electrically conductive particle group and the second electrically conductive particle group are present in a first region and a second region, respectively, which differ from each other in the thickness direction of the anisotropic conductive film and are parallel to the plane direction. Moreover, the first electrically conductive particle
(Continued)

group and the second electrically conductive particle group differ from each other in an existence state of the electrically conductive particles.

13 Claims, 4 Drawing Sheets

(51) Int. Cl.
  *H05K 3/32* (2006.01)
  *C09J 9/02* (2006.01)
  *H01R 4/04* (2006.01)
  *B32B 5/14* (2006.01)
  *C08K 9/02* (2006.01)
  *B32B 27/20* (2006.01)

(58) Field of Classification Search
  CPC .... C08K 2201/001; H05K 3/323; H05K 3/32; H05K 1/14; H05K 2201/0272; H05K 2201/0269; H05K 2201/0224; H01R 11/01; H01R 13/2414; H01R 4/04
  See application file for complete search history.

(56) References Cited

FOREIGN PATENT DOCUMENTS

| JP | 2000-178511 A | 6/2000 |
|----|---------------|--------|
| JP | 2003-064324 A | 3/2003 |
| JP | 2007-131649 A | 5/2007 |
| JP | 2009-013416 A | 1/2009 |
| JP | 2009-074020 A | 4/2009 |
| JP | 2011-119495 A | 6/2011 |
| JP | 2014-017248 A | 1/2014 |
| JP | 2015-008129 A | 1/2015 |
| JP | 2015-26584 A | 2/2015 |
| JP | 2015-079717 A | 4/2015 |

OTHER PUBLICATIONS

Jun. 5, 2019 Chinese Office Action issued in Chinese Patent Application No. 201680055475.8.
Dec. 6, 2016 International Search Report issued in International Patent Application No. PCT/JP2016/079781.
Feb. 2, 2018 International Preliminary Report on Patentability issued in International Patent Application No. PCT/JP2016/079781.
Dec. 6, 2016 Written Opinion issued in International Patent Application No. PCT/JP2016/079781.
Aug. 4, 2020 Notice of Reasons for Refusal issued in Japanese Patent Application No. 2016-197853.
Mar. 16, 2020 Office Action issued in Chinese Patent Application No. 201680055475.8.
Sep. 11, 2020 Office Action issued in Taiwanese Patent Application No. 105132481.
Nov. 3, 2020 Office Action issued in Chinese Patent Application No. 201680055475.8.
Apr. 1, 2021 Office Action issued in Chinese Patent Application No. 201680055475.8.
Apr. 25, 2025 Notice of Hearing/Office Action issued in Chinese Patent Application No. 201680055475.8.

* cited by examiner

ANISOTROPIC CONDUCTIVE FILM AND CONNECTION STRUCTURE

TECHNICAL FIELD

The present invention relates to an anisotropic conductive film and a connection structure.

BACKGROUND ART

An anisotropic conductive film is widely used in mounting of an electronic component such as an IC chip on a transparent substrate for a display element. In recent years, from the perspective of application in high-density mounting, an anisotropic conductive film with a two-layer structure formed by laminating an insulating resin layer having a relatively large layer thickness, and an electrically conductive particle-containing layer having a relatively small layer thickness and including electrically conductive particles dispersed in an insulating binder have been used to enhance capturing efficiency of electrically conductive particles or connection reliability and to reduce a short circuit occurrence rate. In such an anisotropic conductive film, the use of a photocurable resin composition as an insulating binder for the electrically conductive particle-containing layer has been proposed to suppress excessive flow of electrically conductive particles in the event of thermal pressing from the insulating resin layer side at the time of anisotropic conductive connection (Patent Literature 1). In this case, the electrically conductive particle-containing layer is photocured in advance to favorably hold the electrically conductive particles.

CITATION LIST

Patent Literature

Patent Literature 1: JP 2003-64324 A

SUMMARY OF INVENTION

Technical Problem

However, when a substrate is anisotropically conductively connected with an electronic component such as an IC chip by using an anisotropic conductive film including an electrically conductive particle-containing layer including electrically conductive particles dispersed in a photocured insulating binder, there have been a problem such as a possibility of short circuit that cannot be eliminated due to formation of aggregates of electrically conductive particles, and also a problem such as reduction in capturing capability of electrically conductive particles at a bump edge of the electronic component, insufficient pushing of electrically conductive particles into wiring or a bump, and consequently reduction not only in initial conductivity but also in conduction reliability after an aging test.

A problem to be solved by the present invention is to provide an anisotropic conductive film which suppresses occurrence of short circuit at the time of anisotropic conductive connection, prevents reduction in capturing capability of electrically conductive particles, enables favorable pushing of electrically conductive particles and exhibits not only favorable initial conductivity but also favorable conduction reliability.

Solution to Problem

In light of the fact that a conventional anisotropic conductive film contains only one electrically conductive particle group exhibiting parallel spread on a film surface, the present inventors have found out that the objective described above can be achieved by disposing a plurality of electrically conductive particle groups differing from one another in terms of number density, an average particle diameter or the like, respectively in regions differing in a film thickness direction, and the present inventors have completed the present invention represented by <1> and <13> below.

<1> That is, the present invention provides an anisotropic conductive film containing a first electrically conductive particle group and a second electrically conductive particle group, each including a plurality of electrically conductive particles, in an insulating binder;

wherein the first electrically conductive particle group and the second electrically conductive particle group are present in a first region and a second region, respectively, which differ from each other in a thickness direction of the anisotropic conductive film and are parallel to a plane direction; and the first electrically conductive particle group and the second electrically conductive particle group differ from each other in an existence state of the electrically conductive particles. This anisotropic conductive film has preferable aspects of <2> to <12> below.

<2> The anisotropic conductive film according to <1>, wherein the first electrically conductive particle group and the second electrically conductive particle group differ from each other in the existence state of the electrically conductive particles with respect to: an amount of electrically conductive particles present from a perspective of number density or mass; an average particle diameter of the electrically conductive particles; hardness or compression strength of the electrically conductive particles; a surface shape of each of the electrically conductive particles; a surface material of the electrically conductive particles; disposition of the electrically conductive particles; or melt viscosity or composition of the insulating binder in which the electrically conductive particles are dispersed.

<3> The anisotropic conductive film according to <1> or <2>, wherein the respective electrically conductive particles constituting the first electrically conductive particle group exist at roughly the same distance from a surface of the anisotropic conductive film in the first region.

<4> The anisotropic conductive film according to <3>, wherein the respective electrically conductive particles constituting the first electrically conductive particle group exist independently of one another in a plan view of the anisotropic conductive film.

<5> The anisotropic conductive film according to <4>, wherein the respective electrically conductive particles constituting the first electrically conductive particle group are arranged regularly in a lattice form.

<6> The anisotropic conductive film according to any one of <1> to <5>, wherein the respective electrically conductive particles constituting the second electrically conductive particle group exist being dispersed in the second region.

<7> The anisotropic conductive film according to any one of <1> to <6>, further including a third region differing from the first region and the second region in the thickness direction of the anisotropic conductive film, being parallel to the plane direction and containing no electrically conductive particle.

<8> The anisotropic conductive film according to <7>, wherein the first region, the second region and the third region are disposed in this order.

<9> The anisotropic conductive film according to <7>, wherein the first region, the third region and the second region are disposed in this order.

<10> The anisotropic conductive film according to <7>, wherein the second region, the first region and the third region are disposed in this order.

<11> The anisotropic conductive film according to any one of <1> to <6>, wherein a third electrically conductive particle group including a plurality of electrically conductive particles is further contained in the insulating binder; and the third electrically conductive particle group differs from the first region and the second region in the thickness direction of the anisotropic conductive film, and is present in a fourth region parallel to the plane direction.

<12> The anisotropic conductive film according to <11>, wherein the fourth region, the first region and the second region are disposed in this order.

<13> In addition, the present invention provides a connection structure including:

the anisotropic conductive film according to any one of <1> to <12> above; a first electronic component; and a second electronic component; wherein the first electronic component is anisotropically conductively connected to the second electronic component by using the anisotropic conductive film.

Advantageous Effects of Invention

The anisotropic conductive film of the present invention is an anisotropic conductive film containing a first electrically conductive particle group and a second electrically conductive particle group, each including a plurality of electrically conductive particles, in an insulating binder. The first electrically conductive particle group and the second electrically conductive particle group are present in a first region and a second region, respectively, which differ from each other in a thickness direction of the anisotropic conductive film and are parallel to a plane direction, and the second electrically conductive particle group differs from the first electrically conductive particle group in the existence state of the electrically conductive particles. Therefore, even when some of properties including suppression of short circuit occurrence, capturing capability of electrically conductive particles, initial conductivity and conduction reliability cannot be satisfied by the first electrically conductive particle group alone, the insufficient properties can be compensated for by the second electrically conductive particle group which is present in the anisotropic conductive film and in which the existence state of electrically conductive particles is adjusted.

DESCRIPTION OF EMBODIMENTS

Figure 1:
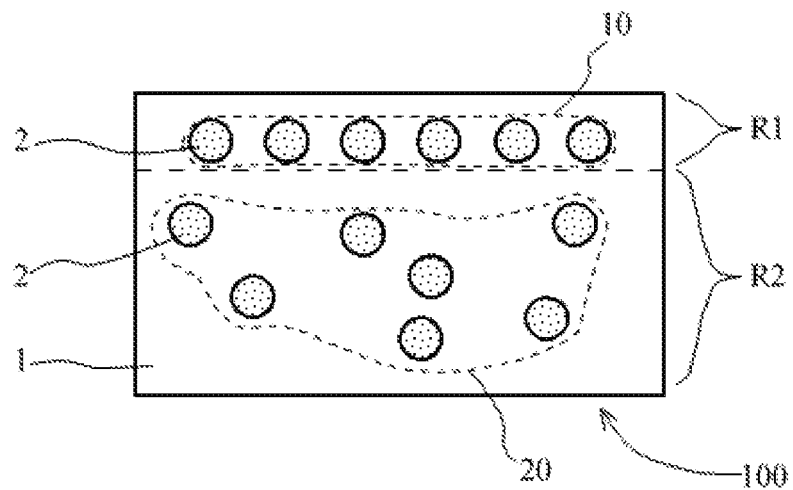
FIG. 1 is a cross-sectional view of an anisotropic conductive film of the present invention.

Examples of an anisotropic conductive film of the present invention will be described in detail below with reference to the drawings. Note that in the drawings, identical reference signs indicate identical or equivalent constituents.

Overall Configuration of Anisotropic Conductive Film

FIG. 1 is a cross-sectional view of an anisotropic conductive film 100 of an example of the present invention. This anisotropic conductive film 100 contains a first electrically conductive particle group 10 and a second electrically conductive particle group 20, each including a plurality of electrically conductive particles 2, in an insulating binder 1. These electrically conductive particle groups 10, 20 are present in a first region R1 and a second region R2, respectively, which differ from each other in a thickness direction of the anisotropic conductive film 100 and are parallel to a plane direction. In the present invention, the first electrically conductive particle group 10 and the second electrically conductive particle group 20 differ from each other generally in an existence state of the electrically conductive particles 2.

Existence State of Electrically Conductive Particles 2

In the present invention, the first electrically conductive particle group 10 and the second electrically conductive particle group 20 need to differ from each other in the existence state of the electrically conductive particles 2. This is for the purpose of eliminating any defect in the anisotropic conductive film originating from one of the electrically conductive particle groups by the other electrically conductive particle group. Specific examples of such an existence state of the electrically conductive particles 2 include, but are not limited to, an amount of the electrically conductive particles 2 present from the perspective of number density or mass; an average particle diameter of the electrically conductive particles 2; hardness or compression strength of the electrically conductive particles 2; a surface shape of each of the electrically conductive particles 2; a surface material (a metal plated film or an insulating film) of the electrically conductive particles 2; disposition of the electrically conductive particles 2; and melt viscosity or composition of the insulating binder 1 in which the electrically conductive particles 2 are dispersed.

Any one of the electrically conductive particle groups can be selected appropriately to be prioritized over the other electrically conductive particle group with regard to a large/small relation, a high/low relation, a front/back relation, a raw material relation or the like indicating the above-described differences in the existence state of the electrically conductive particles 2 (for example, an average particle diameter of the electrically conductive particles in one of the electrically conductive particle groups is made larger than an average particle diameter of the electrically conductive particles in the other electrically conductive particle group). Specifically, when an average particle diameter, hardness and the like of the electrically conductive particles 2 are the same but number density differs between the first electrically conductive particle group 10 and the second electrically conductive particle group 20, it can be considered that the first electrically conductive particle group 10 and the second electrically conductive particle group 20 generally differ from each other in the existence state of the electrically conductive particles 2.

Note that although two or more types of electrically conductive particles may be used in combination within one electrically conductive particle group, the electrically conductive particles preferably exist to be discriminable between the different electrically conductive particle groups.

Number Density of Electrically Conductive Particles

Number density of the electrically conductive particles 2 may be the same or different between the first electrically conductive particle group 10 and the second electrically conductive particle group 20. However, from the perspective of enhancing capturing capability of the electrically conductive particles between opposing terminals, the number density is preferably from 5000 to 40000 particles/mm$^2$ and more preferably from 10000 to 30000 particles/mm$^2$ in the first electrically conductive particle group 10, and from the perspective of avoiding poor connection due to superposition of the electrically conductive particles, the number density is preferably from 1000 to 20000 particles/mm$^2$ and more preferably from 2000 to 10000 particles/mm$^2$ in the second electrically conductive particle group 20. Moreover, from the perspective of achieving both reduction in the number of the electrically conductive particles and reliability of capturing, the number density of the electrically conductive particles 2 in the first electrically conductive particle group 10 is preferably from 2 to 10 times and more preferably from 3 to 5 times the number density of the electrically conductive particles in the second electrically conductive particle group 20. Here, the number density can be measured by observing and measuring the electrically conductive particles in a plan view with a metallurgical microscope and by measuring cross sections of the electrically conductive particles with an electron microscope such as an SEM.

Average Particle Diameter of Electrically Conductive Particles

An average particle diameter of the electrically conductive particles 2 may be the same or different between the first electrically conductive particle group 10 and the second electrically conductive particle group 20. However, from the perspective of stability of anisotropic conductive connection, the average particle diameter is preferably from 1 to 100 μm, and a CV value is preferably within 25%. The average particle diameter can be calculated from the results of observation with an image-type particle distribution measurement device or a metallurgical microscope by using measurement software (for example, WinROOF, Mitani Corporation).

When the average particle diameter of the electrically conductive particles 2 is the same between the first electrically conductive particle group 10 and the second electrically conductive particle group 20, the effect of the insufficient capturing capability being compensated for with capturing capability of the electrically conductive particles in the second electrically conductive particle group 20 can be anticipated even when capturing capability of the electrically conductive particles in the first electrically conductive particle group 10 is insufficient.

In addition, when the average particle diameter of the electrically conductive particles 2 differs between the first electrically conductive particle group 10 and the second electrically conductive particle group 20, the effect of ensuring favorable conduction reliability can be anticipated even when at least one of opposing terminals is not smooth at the time of anisotropically conductively connecting the opposing terminals to each other. This is because at least one of opposing terminal faces is not smooth, and therefore, comparatively large electrically conductive particles become sandwiched between the terminals and these particles can be expected to contribute to the stability of conduction. In addition, the effect of easily confirming a behavior of resin flow at the time of anisotropic conductive connection can also be anticipated. This is because the first electrically conductive particle group 10 and the second electrically conductive particle group 20 are present in different regions in the thickness direction of the anisotropic conductive film, and therefore, a behavior of resin flow can be inferred easily from a state of the resin flow after anisotropic conductive connection. Accordingly, suitability of anisotropic conductive connection can be expected to be easily estimated by comparing behaviors of the respective electrically conductive particles of the first electrically conductive particle group 10 and the second electrically conductive particle group 20 present in different regions in the thickness direction, as compared to the case of estimating the suitability only from the behavior of resin flow or of void generation with insufficient reproducibility.

Hardness of Electrically Conductive Particles

Hardness of the electrically conductive particles 2 may be the same or different between the first electrically conductive particle group 10 and the second electrically conductive particle group 20. Here, from the perspective of a relationship of the hardness with the average particle diameter of the electrically conductive particles 2, when the electrically conductive particles 2 having different average particle diameters are used, the hardness of the comparatively larger electrically conductive particles is preferably lower than the hardness of the comparatively smaller electrically conductive particles, but the hardness may be the same as long as sufficient compression can be expected and anisotropic conductive connection is not inhibited.

The electrically conductive particles 2 can be selected appropriately and used from among electrically conductive particles used in conventionally known anisotropic conductive films, and metal particles such as nickel, cobalt, silver, copper, gold, palladium and solder, or resin core metal plated particles can be used. Examples of metal plating raw materials include copper, nickel, gold, silver and solder. Such metal plating can also be formed as a multilayer. A metal plating thickness is ordinarily from 50 to 300 nm. Particularly, the resin core metal plated particles can preferably be used as the electrically conductive particles 2 from the perspective of conduction reliability or stability, and hardness of the resin core metal plated particles will be described below.

The hardness of the resin core metal plated particles is roughly the same as hardness of a resin core, because the metal plating thickness is relatively much smaller than a resin core diameter. The hardness of the resin core can be selected appropriately on the basis of an object to be anisotropically conductively connected, but the resin core preferably has hardness at which the resin core is compressed to approximately 70 to 80% after anisotropic conductive connection. Therefore, compressive deformability of the resin core is variously selected on the basis of combinations of electronic components to be connected. Generally, comparatively soft particles having compression hardness (K value) at 20% deformation ranging from 1500 to 4000 N/mm$^2$ are preferred. In the case of anisotropically conductively connecting an FPC to an FPC (FOF), comparatively soft particles having compression hardness (K value) at 20% deformation ranging from 1500 to 4000 N/mm$^2$ are also preferred. In the case of anisotropically conductively connecting an IC chip to a glass substrate, comparatively hard particles having compression hardness (K value) at 20% deformation ranging from 3000 to 8000 N/mm$^2$ are preferred. In addition, regardless of materials, in the case of an electronic component including a wiring surface on which an oxide film is formed, harder particles having compression hardness (K value) at 20% deformation of greater than or equal to 8000 N/mm$^2$ may be preferred.

Here, the compression hardness (K value) at 20% deformation refers to a value calculated by the following formula from a load applied to an electrically conductive particle in a direction in which the electrically conductive particle is compressed such that a particle diameter of the electrically conductive particle decreases by 20% from an original particle diameter of the electrically conductive particle. The smaller the K value, the softer the particle.

$$K=(3\sqrt{2})F \cdot S^{-3/2} \cdot R^{-1/2}$$

F: a load at 20% compression deformation of an electrically conductive particle;
S: compression displacement (mm); and
R: a radius (mm) of the electrically conductive particle.

A particle including a plastic raw material excellent in compressive deformation is preferably used as the resin core described above. For example, the resin core can be formed with a (meth)acrylate resin, a polystyrene resin, a styrene-(meth)acrylate copolymer resin, a urethane resin, an epoxy resin, a phenolic resin, an acrylonitrile-styrene (AS) resin, a benzoguanamine resin, a divinylbenzene resin, a styrene resin, a polyester resin and the like. For example, when the resin core is formed with a (meth)acrylate resin, the (meth)acrylate resin is preferably a copolymer of a (meth)acrylic ester and, as necessary, a compound copolymerizable with the (meth)acrylic ester and having reactive double bonds, and a bifunctional or polyfunctional monomer.

Surface Shape of Each of Electrically Conductive Particles

A surface shape of each of the electrically conductive particles 2 may be the same or different between the first electrically conductive particle group 10 and the second electrically conductive particle group 20. The surface shape is not limited as long as the surface shape does not impair the effect of the invention, but electrically conductive particles including surfaces on which projections are formed, as described in JP 2015-8129 A, for example, can preferably be used. Since such projections are formed, a protective film provided on a terminal can be broken at the time of anisotropic conductive connection. The projections are preferably formed to be present uniformly on the surfaces of the electrically conductive particles. However, some of the projections may be absent at a step of filling a mold with the electrically conductive particles to arrange the electrically conductive particles in steps of producing the anisotropic conductive film. A height of each of the projections can range from 10 to 500 nm or can be less than or equal to 10% of the particle diameter, for example.

Surface-Insulating Film of Electrically Conductive Particles

A surface-insulating film is preferably formed on each of the electrically conductive particles 2. This is because occurrence of short circuit can be suppressed even when a space between terminals is small. Such a surface-insulating film may assume any form as long as the form does not obstruct anisotropic conductive connection, and the form of the surface-insulating film may be the same or different between the first electrically conductive particle group 10 and the second electrically conductive particle group 20.

Amount of Electrically Conductive Particles Present from Perspective of Mass

An amount of the electrically conductive particles 2 present in the anisotropic conductive film 100 can be expressed in terms of mass, and may be the same or different between the first electrically conductive particle group 10 and the second electrically conductive particle group 20. However, when the total mass of the anisotropic conductive film 100 is defined as 100 parts by mass, the amount of the electrically conductive particles 2 in 100 parts by mass of the anisotropic conductive film 100 is preferably not less than 1 part by mass and not more than 30 parts by mass, and more preferably not less than 3 parts by mass and not more than 10 parts by mass.

Disposition of Electrically Conductive Particles

In the anisotropic conductive film 100 of the present invention, from the perspective of short circuit suppression, the electrically conductive particles 2 of at least one of the electrically conductive particle groups (preferably, the first electrically conductive particle group 10) exist independently of one another in a plan view of the anisotropic conductive film 100. In this case, a state of a distance or disposition in a plane direction of the electrically conductive particles may be the same or different between the first electrically conductive particle group 10 and the second electrically conductive particle group 20. Here, to "exist independently of one another" refers to a state in which, in at least one of the electrically conductive particle groups, the electrically conductive particles 2 do not aggregate and are not in contact with one another, and there is no overlapping in a film thickness direction of the electrically conductive particles 2. The degree of "being not in contact" is preferably such that a distance between the centers of the electrically conductive particles 2 adjacent to each other is from 1.5 to 50 times and more preferably from 2 to 30 times the average particle diameter. In addition, the "state in which there is no overlapping in a film thickness direction" refers to a state in which, in the plan view of the anisotropic conductive film, the electrically conductive particles of at least one of the electrically conductive particle groups do not overlap with other electrically conductive particles of the same electrically conductive particle group.

Note that a proportion of the "electrically conductive particles existing independently" with respect to all of the electrically conductive particles in the plan view of the anisotropic conductive film is preferably greater than 50%, more preferably greater than 60%, and even more preferably greater than 70%. This proportion can be measured from a plan field image obtained with a metallurgical microscope or an electron microscope.

As described above, the electrically conductive particles 2 exist independently of one another in the plan view of the anisotropic conductive film 100, but the electrically conductive particles 2 are preferably arranged regularly to establish uniform light transmission entirely in the anisotropic conductive film 100. As the regular arrangement, the electrically conductive particles 2 are preferably arranged in a lattice form such as a hexagonal lattice, a oblique lattice, a square lattice, a rectangular lattice and a parallelepiped lattice. In addition, instead of the lattice form, the electrically conductive particles 2 may be arranged in straight lines formed in parallel. In this case, the lines preferably traverse diagonally in a width direction of the film. A distance between the lines is not particularly limited and may be regular or random, but the distance is preferably regular from the perspective of practical use.

On the other hand, from the perspective of further enhancing capturing of electrically conductive particles between terminals, the electrically conductive particles 2 of the second electrically conductive particle group 20 preferably exist being dispersed in the second region R2. Here, to "exist being dispersed" means that the electrically conductive particles exist randomly, rather than regularly. To make the electrically conductive particles 2 exist randomly, the electrically conductive particles 2 may be fed into the insulating binder 1 and mixed by using a commercially available planetary centrifugal mixer (Awatori Rentaro, Thinky Corporation).

80° C. Melt Viscosity of Insulating Binder

80° C. melt viscosity of the insulating binder 1 described below may be the same or different between the first electrically conductive particle group 10 and the second electrically conductive particle group 20, but is preferably different in the thickness direction. In particular, from the perspective of capturing electrically conductive particles between terminals, 80° C. melt viscosity in the first region R1 containing the first electrically conductive particle group 10 is more preferably greater than 80° C. melt viscosity in the second region R2 containing the second electrically conductive particle group 20. When the first electrically conductive particle group 10 and the second electrically conductive particle group 20 exist as separate layers, the first electrically conductive particle group 10 may exist at an interface of layers with different 80° C. melt viscosity. Note that the same may apply to minimum melt viscosity, instead of the 80° C. melt viscosity.

In a layer containing electrically conductive particles, as the 80° C. melt viscosity of the insulating binder increases, the electrically conductive particles become less susceptible to an effect of resin flow at the time of connection as described above, and therefore, the 80° C. melt viscosity is desirable higher from the perspective of capturing electrically conductive particles between terminals. Specifically, the 80° C. melt viscosity is not particularly limited, but may be 20000 Pa·s or greater. In addition, as an example, the 80° C. melt viscosity of the first region R1 containing the first electrically conductive particle group 10 is more preferably from 1000 to 20000 Pa·s and more preferably from 2000 to 8000 Pa·s, and the 80° C. melt viscosity of the second region R2 containing the second electrically conductive particle group 20 is preferably from 500 to 20000 Pa·s and more preferably from 1000 to 5000 Pa·s. Here, the 80° C. melt viscosity can be determined from a value at 80° C. measured by using a rotary rheometer (TA Instruments) under conditions including a heating rate of 10° C./min, constant force of 1 N at the time of measurement, and a working measurement plate diameter of 8 mm.

Composition of Insulating Binder

As described above, a known insulating binder used in a conventional anisotropic conductive film may be used as the insulating binder 1 which may be a factor in distinguishing the existence states of the electrically conductive particles 2. A known thermo-polymerizable or photopolymerizable composition can be used as such an insulating binder. These polymerizable compositions preferably contain a film-forming resin or a silane coupling agent. Examples of the film-forming resin can include a phenoxy resin, an epoxy resin, an unsaturated polyester resin, a saturated polyester resin, a urethane resin, a butadiene resin, a polyimide resin, a polyamide resin and a polyolefin resin, and two or more types of these resins may be used in combination. Of these, a phenoxy resin is preferably used from the perspectives of film formability, processability and connection reliability. In addition, examples of the silane coupling agent can include an epoxy-based silane coupling agent and an acrylic-based silane coupling agent. These silane coupling agents are primarily alkoxysilane derivatives.

Further, a filler, a softening agent, a promoter, an antioxidant, a colorant (a pigment, a dye), an organic solvent, an ion-trapping agent or the like may also be compounded with these polymerizable compositions as necessary. In particular, a silica filler having an average particle diameter of from 10 to 50 nm is preferably compounded to adjust viscosity of the polymerizable composition. A compounding proportion of such a silica filler in the polymerizable composition can be determined appropriately in accordance with desired viscosity.

Thermo-Polymerizable Composition

An example of a thermo-polymerizable composition includes a thermo-polymerizable composition containing a (meth)acrylate compound or an epoxy compound and a thermal cationic, anionic or radical polymerization initiator. The thermo-polymerizable composition may contain a photopolymerization initiator as necessary.

Here, a conventionally known (meth)acrylate monomer may be used as the (meth)acrylate compound. For example, a monofunctional (meth)acrylate monomer or a bifunctional or greater polyfunctional (meth)acrylate monomer can be used. In the present invention, a polyfunctional (meth)acrylate monomer is preferably used for at least part of the (meth)acrylate monomer such that the insulating binder can be heat-cured at the time of anisotropic conductive connection. Here, (meth)acrylate includes acrylate and methacrylate.

In addition, examples of the epoxy compound can include a bisphenol A epoxy resin, a bisphenol F epoxy resin, a novolac epoxy resin, modified epoxy resins of these epoxy resins and an alicyclic epoxy resin, and two or more types of these epoxy resins can be used in combination. In addition, an oxetane compound may also be used in combination with the epoxy compound.

Examples of the thermal radical polymerization initiator can include an organic peroxide and an azo compound. In particular, an organic peroxide which does not generate nitrogen that causes bubbles can preferably be used.

When an amount of the thermal radical polymerization initiator that is used is too small, curing becomes poor, whereas when the amount is too large, a product life reduces, and thus, the amount of the thermal radical polymerization initiator that is used is preferably from 2 to 60 parts by mass and more preferably from 5 to 40 parts by mass with respect to 100 parts by mass of the acrylate compound.

A known thermal cationic polymerization initiator for an epoxy compound can be used as the thermal cationic polymerization initiator. For example, an iodonium salt, a sulfonium salt, a phosphonium salt and ferrocenes, which generate acids in response to heat, can be used. In particular, an aromatic sulfonium salt that exhibits favorable latency with respect to temperature can preferably be used.

When a compounded amount of the thermal cationic polymerization initiator is too small, curing tends to become poor, whereas when the compounded amount is too large, a product life tends to reduce, and thus, the compounded amount is preferably from 2 to 60 parts by mass and more preferably from 5 to 40 parts by mass with respect to 100 parts by mass of the epoxy compound.

A known thermal anionic polymerization initiator for an epoxy compound can be used as the thermal anionic polymerization initiator. For example, an aliphatic amine compound, an aromatic amine compound, a secondary or tertiary amine compound, an imidazole compound, a polymercaptan compound, a boron trifluoride-amine complex, a dicyandiamide, an organic acid hydrazide and the like, which generate bases in response to heat, can be used. In particular, a capsulized imidazole compound that exhibits favorable latency with respect to temperature can preferably be used.

When a compounded amount of the thermal anionic polymerization initiator is too small, curing tends to become poor, whereas when the compounded amount is too large, a product life tends to reduce, and thus, the compounded amount is preferably from 2 to 60 parts by mass and more preferably from 5 to 40 parts by mass with respect to 100 parts by mass of the epoxy compound.

Photopolymerizable Composition

An example of a photopolymerizable composition is a photoradical polymerizable composition containing a photocationic, photoanionic or photoradical polymerizable composition, preferably a (meth)acrylate compound and a photoradical polymerization initiator, or is a photocationic or photoanionic polymerizable composition containing an epoxy compound and a photocationic or photoanionic polymerization initiator.

Here, a compound used in a thermo-polymerizable composition can be used appropriately as the epoxy compound or the (meth)acrylate compound.

Examples of the photoradical polymerization initiator include known polymerization initiators such as an acetophenone-based photopolymerization initiator, a benzyl ketal-based polymerization initiator and a phosphorus-based polymerization initiator.

When an amount of the photoradical polymerization initiator that is used is too small with respect to 100 parts by mass of the acrylate compound, polymerization does not progress sufficiently, whereas when the amount is too large, this may cause reduction in rigidity, and thus, the amount of the photoradical polymerization initiator that is used is preferably from 0.1 to 25 parts by mass and more preferably from 0.5 to 15 parts by mass.

A known photocationic polymerization initiator for an epoxy compound can be used as a photocationic polymerization initiator. For example, an iodonium salt, a sulfonium salt, a phosphonium salt and ferrocenes, which generate acids in response to light, can be used. In particular, an aromatic sulfonium salt which exhibits favorable latency with respect to temperature can preferably be used.

When a compounded amount of the photocationic polymerization initiator is too small, curing tends to become poor, whereas when the compounded amount is too large, a product life tends to reduce, and thus, the compounded amount is preferably from 2 to 60 parts by mass and more preferably from 5 to 40 parts by mass with respect to 100 parts by mass of the epoxy compound.

A known photoanionic polymerization initiator of an epoxy compound can be used as the photoanionic polymerization initiator. For example, acetophenone O-aroyloxime and nifedipine, which generate bases in response to light, can preferably be used.

When a compounded amount of the photoanionic polymerization initiator is too small, curing tends to become poor, whereas when the compounded amount is too large, a product life tends to reduce, and thus, the compounded amount is preferably from 2 to 60 parts by mass and more preferably from 5 to 40 parts by mass with respect to 100 parts by mass of the epoxy compound.

Layer Configuration of Anisotropic Conductive Film

The anisotropic conductive film 100 of the present invention may be constituted as a single layer or as a multilayer formed by lamination of a plurality of layers.

When the anisotropic conductive film 100 is constituted as a single layer, the first electrically conductive particle group 10 includes a plurality of electrically conductive particles localized in the anisotropic conductive film 100 constituted as a single layer, and a region where the electrically conductive particles are localized is the first region R1. On the other hand, the second electrically conductive particle group 20 includes a plurality of electrically conductive particles dispersed in the anisotropic conductive film 100 constituted as a single layer, and a region where the electrically conductive particles are dispersed is the second region R2.

When the anisotropic conductive film 100 is constituted as a multilayer, the first region R1 and the second region R2 can be understood to be a first electrically conductive particle group-containing layer and a second electrically conductive particle group-containing layer, respectively.

To achieve adhesive force to reliably hold conduction reliability, a thickness of the first region R1 (first electrically conductive particle group-containing layer) is preferably from 3 to 7 μm and more preferably from 3 to 5 μm, and a thickness of the second region R2 (second electrically conductive particle group-containing layer) is preferably from 3 to 20 μm and more preferably from 6 to 16 μm. The thickness ranges of these regions (electrically conductive particle group-containing layers) are merely examples of preferable thickness ranges under conditions in the examples described below, and are not limited especially but may be varied appropriately in accordance with particle diameters of the electrically conductive particles constituting each of the electrically conductive particle groups, or may be varied in accordance with a type or shape of an electronic component to be connected.

Anisotropic Conductive Film in Aspect Other than Aspect Illustrated in FIG. 1

Figure 3:
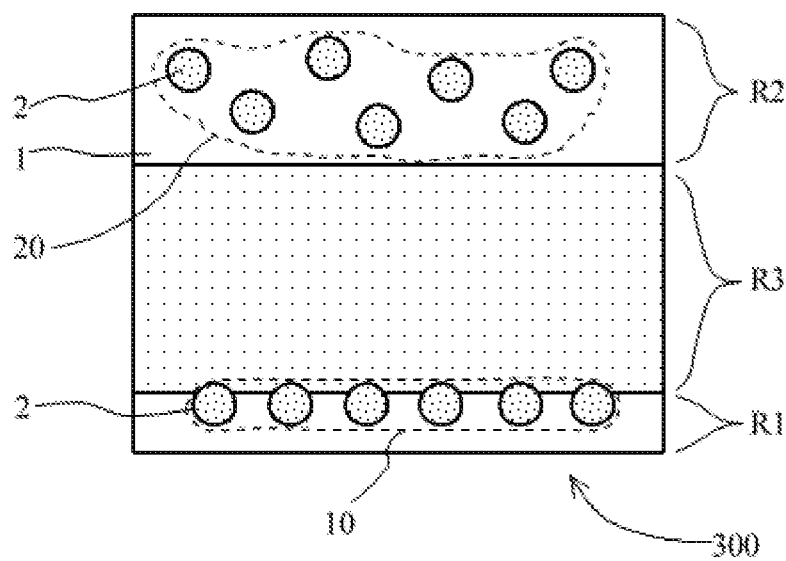
FIG. 3 is a cross-sectional view of an anisotropic conductive film of the present invention.
Figure 4:
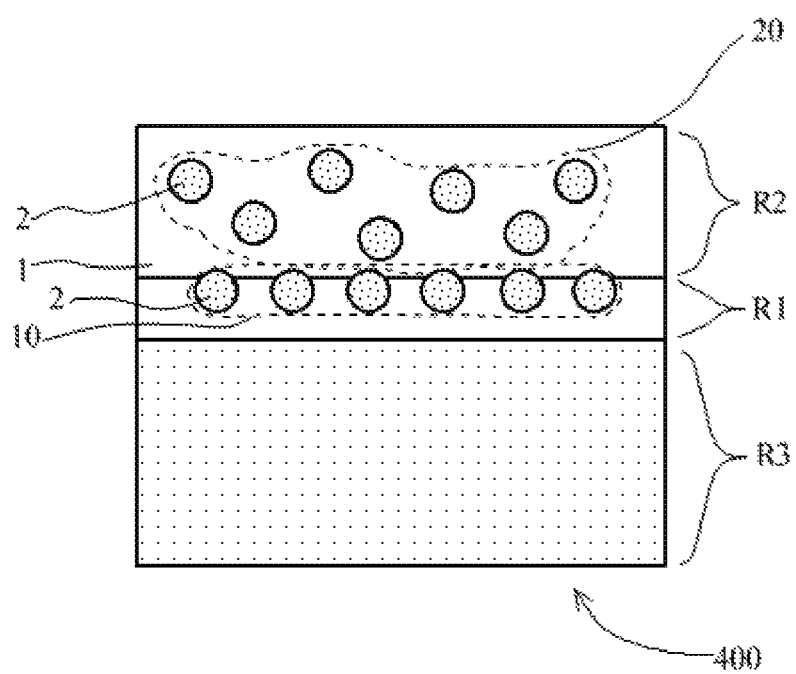
FIG. 4 is a cross-sectional view of an anisotropic conductive film of the present invention.

The anisotropic conductive film 100 in the aspect illustrated in FIG. 1 is described above, but the present invention also includes an anisotropic conductive film further including a third region differing from the first region and the second region in the thickness direction of the anisotropic conductive film, being parallel to the plane direction and containing no electrically conductive particle. This third region is generally a layer configured to establish smooth resin flow. Specific examples of such an aspect are illustrated in FIGS. 2 to 4.

Figure 2:
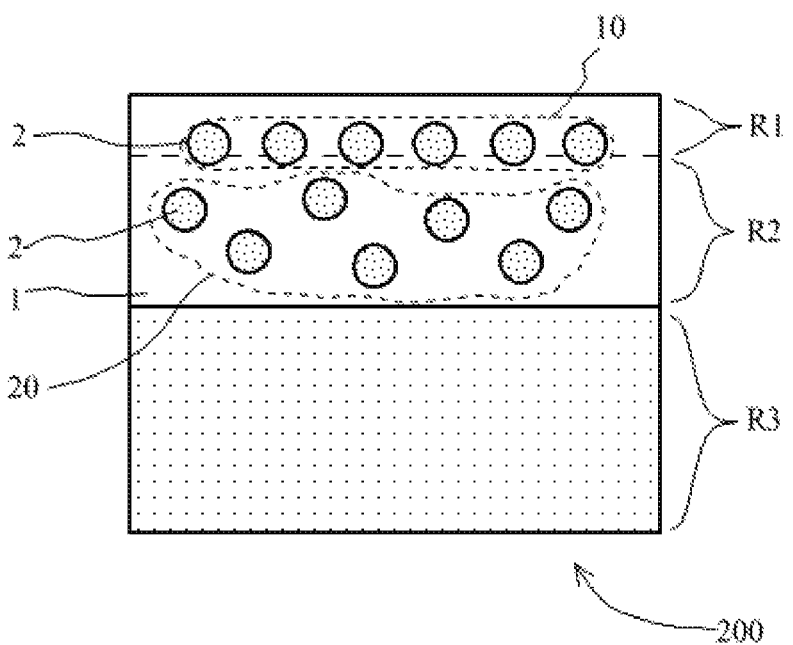
FIG. 2 is a cross-sectional view of an anisotropic conductive film of the present invention.

That is, an anisotropic conductive film 200 illustrated in FIG. 2 is in an aspect in which the first region R1, the second region R2 and the third region R3 are disposed in this order. An anisotropic conductive film 300 illustrated in FIG. 3 is in an aspect in which the second region R2, the third region R3 and the first region R1 are disposed in this order. An anisotropic conductive film 400 illustrated in FIG. 4 is in an aspect in which the second region R2, the first region R1 and the third region R3 are disposed in this order.

When the anisotropic conductive film is constituted as a single layer, such a third region R3 is a region where the electrically conductive particles 2 are not present, and when the anisotropic conductive film is constituted as a multilayer, the third region R3 is positioned as an insulating layer including an insulating binder containing no electrically conductive particle. Here, the insulating binder constituting the third region R3 may include the thermo- or photopolymerizable composition described above with regard to the first region R1 and the second region R2.

Figure 5:
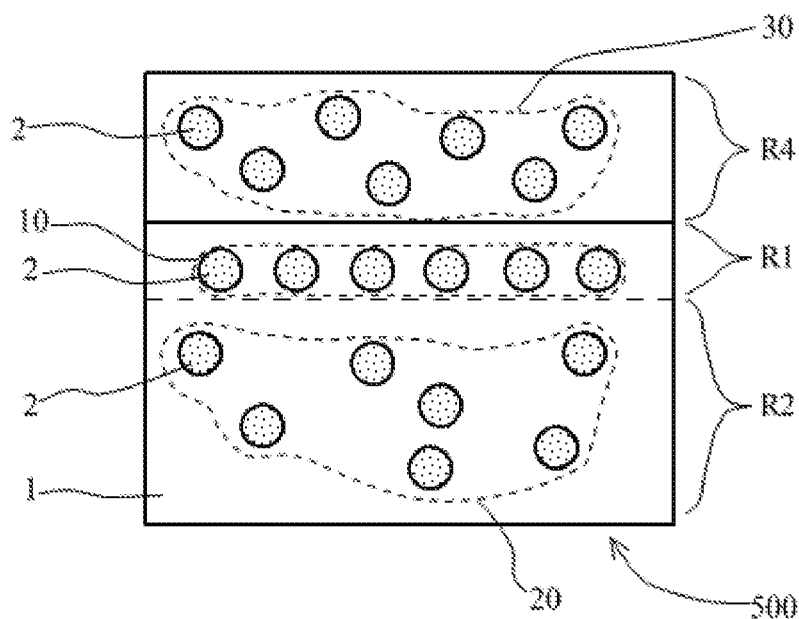
FIG. 5 is a cross-sectional view of an anisotropic conductive film of the present invention.

In addition, the present invention also includes an anisotropic conductive film 500 in which a third electrically conductive particle group 30 including a plurality of electrically conductive particles is contained in the insulating binder, and, as illustrated in FIG. 5, the third electrically conductive particle group 30 differs from the first region R1 and the second region R2 in the thickness direction of the anisotropic conductive film 500, and is present in a fourth region R4 parallel to the plane direction.

That is, the anisotropic conductive film 500 illustrated in FIG. 5 is in an aspect in which the fourth region R4 where the third electrically conductive particle group 30 is present, the first region R1 where the first electrically conductive particle group 10 is present and the second region R2 where the second conductive particle group 20 is present are disposed in this order. Here, the third electrically conductive particle group 30 needs to differ from at least the first electrically conductive particle group 10 in the existence state of the conductive particles 2. On the other hand, the third electrically conductive particle group 30 may be the same as or differ from the second electrically conductive particle group 20 in the existence state of the electrically conductive particles 2, but the third electrically conductive particle group 30 preferably differ from the second electrically conductive particle group 20 in the existence state of the electrically conductive particles 2.

When the anisotropic conductive film is constituted as a single layer, such a fourth region R4 is a region where the electrically conductive particles 2 are present, and when the anisotropic conductive film is constituted as a multilayer, the fourth region R4 is positioned as a third electrically conductive particle group-containing layer including an insulating binder containing electrically conductive particles. Here, the insulating binder constituting the fourth region R4 can include the thermo- or photopolymerizable composition described above with regard to the first region R1 and the second region R2.

Note that in the aspect illustrated in FIG. 5, from the perspective of enhancing capturing capability, number density of the electrically conductive particles 2 in the third electrically conductive particle group 30 is preferably from 3000 to 10000 particles/mm$^2$ and more preferably from 3000 to 5000 particles/mm$^2$. In addition, a type, an average particle diameter, hardness, a surface material and the like of the electrically conductive particles 2 are handled in roughly the same manner as in the case of the second electrically conductive particle group 20 described above.

Production Method for Anisotropic Conductive Film

The anisotropic conductive film of the single-layer type illustrated in FIG. 1 according to the present invention can be obtained, for example, by first making a layer including a first electrically conductive particle group and a layer including a second electrically conductive particle group with use of the same resin composition, and then laminating the layers by heat lamination. In addition, after the second electrically conductive particle group is obtained by a known coating method, drying conditions of a solvent are adjusted appropriately to cause electrically conductive particles to precipitate on one of the films in a state in which a solvent content is high, and to spray or transfer the first electrically conductive particle group. After an operation such as embedding the first electrically conductive particle group is performed, drying can be performed again to produce an anisotropic conductive film.

In addition, as for the anisotropic conductive film 100 of the multilayer type illustrated in FIG. 1 according to the present invention, a second electrically conductive particle group-containing layer is first formed by applying electrically conductive particles dispersed by a common method in an insulating binder to a release film, and drying the release film. Separately, after an adhesive layer is formed by applying an insulating binder to a release film and drying the release film, electrically conductive particles are held on a surface of the adhesive layer in a single layer to form a first electrically conductive particle group-containing layer. Next, an electrically conductive particle holding surface of the first electrically conductive particle group-containing layer is disposed to the second electrically conductive particle group-containing layer, and the entire structure is bonded together to produce an anisotropic conductive film. Here, a conventionally known approach can be used as the approach for holding the electrically conductive particles on the adhesive layer. For example, the first electrically conductive particle group-containing layer can be formed by directly spraying electrically conductive particles onto the adhesive layer. Alternatively, the first electrically conductive particle group-containing layer can be formed by depositing electrically conductive particles onto a resin layer for stretching in a single layer and then biaxially stretching the resin layer to form a stretched film, and by pressing the adhesive layer against the stretched film to transfer the electrically conductive particles to the adhesive layer. In addition, the electrically conductive particles can be held onto the adhesive layer by using a transfer mold. An example in which the anisotropic conductive film of the present invention is produced by using a transfer mold will be described below.

The anisotropic conductive film 100 of the multilayer type illustrated in FIG. 1 can be produced in accordance with the following steps A to D.

First, electrically conductive particles are placed in a plurality of concavities formed in a transfer mold (step A). Subsequently, a polymerizable composition containing a polymerizable compound, a polymerization initiator and, as necessary, an insulating filler is pressed into the electrically conductive particles in the transfer mold to form a first electrically conductive particle group-containing layer to which the electrically conductive particles are transferred (step B). Next, separately from the first electrically conductive particle group-containing layer, a polymerizable composition containing a polymerizable compound and a polymerization initiator and mixed with electrically conductive particles by a common method is formed into a film to form a second electrically conductive particle group-containing layer (step C). The anisotropic conductive film 100 illustrated in FIG. 1 can be obtained by disposing the second electrically conductive particle group-containing layer on an electrically conductive particle transfer surface of the first electrically conductive particle group-containing layer and bonding the entire structure together (step D).

The degree of embedding the electrically conductive particles in the first electrically conductive particle group-containing layer can be varied by adjusting the pressing at step B. The degree of embedding the electrically conductive particles increases with an increase in the degree of pressing, and finally the electrically conductive particles can be embedded completely in the first electrically conductive particle group-containing layer.

Note that the anisotropic conductive films illustrated in FIGS. 2 to 5 can be produced in accordance with the production method for the anisotropic conductive film of FIG. 1 using a transfer mold.

Transfer Mold

The transfer mold used in the production method of the present invention can be a transfer mold including an opening formed by a known opening formation method such as photolithography in an inorganic material such as silicon, various ceramics, glass and a metal such as stainless steel, or in an organic material such as various resins. In addition, the transfer mold can have a shape such as a plate shape and a roll shape.

Examples of the shape of each of the concavities of the transfer mold can include a cylinder shape, a columnar shape such as a rectangular column, and a tapered shape such as a truncated cone, a truncated pyramid, a cone and a square pyramid.

The concavities can be arranged in a lattice form, a staggered lattice form or the like in accordance with arrangement to be imparted to the electrically conductive particles.

A ratio of the average particle diameter of the electrically conductive particles to a concavity depth (=average particle diameter of electrically conductive particles/opening depth) is preferably from 0.4 to 3.0 and more preferably from 0.5 to 1.5 from the perspective of a balance between enhancement of transfer properties and electrically conductive particle holding properties. Note that a concavity diameter and a concavity depth of the transfer mold can be measured with a laser microscope.

A ratio of a concavity opening diameter to the average particle diameter of the electrically conductive particles (=concavity opening diameter/average particle diameter of electrically conductive particles) is preferably from 1.1 to 2.0 and more preferably from 1.3 to 1.8 from the perspective of a balance between ease of accommodating the electrically conductive particles, ease of pressing the polymerizable composition and the like.

Note that when a concavity base diameter is smaller than the concavity opening diameter, the base diameter is preferably not less than 1.1 times and less than 2 times the average particle diameter of the electrically conductive particles, and the opening diameter is preferably not less than 1.3 times and less than 3 times the average particle diameter of the electrically conductive particles.

Connection Structure

The anisotropic conductive film of the present invention can be used preferably in anisotropically conductively connecting a first electronic component such as an IC chip, an IC module and an FPC to a second electronic component such as an FPC, a glass substrate, a rigid substrate and a ceramic substrate. IC chips, IC modules or the like may be stacked one on another to be anisotropically conductively connected to one another. The connection structure thus obtained is also within the scope of the present invention.

As a connection method for electronic components using the anisotropic conductive film, for example, an anisotropic conductive film is temporarily bonded to a second electronic component such as various types of substrates from the adhesive layer side, and a first electronic component such as an IC chip is mounted on the temporarily bonded anisotropic conductive film and subjected to thermocompression bonding. The compression bonding may be performed along with irradiation with an energy beam such as a UV ray, or energy beam irradiation and thermocompression bonding may be used in combination.

EXAMPLES

The present invention will be specifically described in examples below. Note that the "first electrically conductive particle group-containing layer" in Table 1 below is replaced by the term "electrically conductive particle-containing layer" in Comparative Examples 1 and 2.

Example 1: Production of Anisotropic Conductive Film of Multilayer Type Illustrated in FIG. 1

Formation of Second Electrically Conductive Particle Group-Containing Layer

A thermo-polymerizable composition in which electrically conductive particles were dispersed was prepared by mixing 45 parts by mass of a phenoxy resin (YP-50, available from Nippon Steel & Sumikin Chemical Co., Ltd.), 5 parts by mass of a silica filler (Aerosil R805, available from Nippon Aerosil Co., Ltd.), 45 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), 2 parts by mass of a silane coupling agent (KBM-403, available from Shin-Etsu Chemical Co., Ltd.), and 5 parts by mass of electrically conductive particles (AUL703, available from Sekisui Chemical Co., Ltd., particle diameter: 3 µm). This thermo-polymerizable composition was applied onto a release PET film having a film thickness of 50 µm by using a bar coater to achieve the thickness indicated in Table 1 (4 µm), and was dried for 5 minutes in an oven at 80° C. to form a second electrically conductive particle group-containing layer in which electrically conductive particles were dispersed randomly on the PET film. Number density (particles/mm$^2$) of the electrically conductive particles contained in the second electrically conductive particle group-containing layer was measured, and melt viscosity of the second electrically conductive particle group-containing layer was measured by using a rotary rheometer (TA Instruments) under conditions including a heating rate of 10° C./min, constant force of 1 N at the time of measurement and a working measurement plate diameter of 8 mm. A fluidity rank based on a melt viscosity value at 80° C. of the second electrically conductive particle group-containing layer is shown in Table 1.

Fluidity Rank

A: the case where the melt viscosity value is not less than 20000 Pa·s

B: the case where the melt viscosity value is not less than 10000 Pa·s and less than 20000 Pa·s C: the case where the melt viscosity value is not less than 3000 Pa·s and less than 10000 Pa·s D: the case where the melt viscosity value is less than 3000 Pa·s Formation of First Electrically Conductive Particle Group-Containing Layer On the other hand, a mold including a convexity arrangement pattern corresponding to a square lattice pattern was made, and known transparent resin pellets were melted, poured into the mold, and hardened by cooling to make a resin transfer mold including concavities with a square lattice pattern of the density shown in Table 1 (corresponding to the number density of the electrically conductive particles). The concavities of this transfer mold were filled with electrically conductive particles (Sekisui Chemical Co., Ltd., AUL703, particle diameter: 3 µm).

Separately, a thermo-polymerizable composition containing 35 parts by mass of a phenoxy resin (YP-50, available from Nippon Steel & Sumikin Chemical Co., Ltd.), 25 parts by mass of a silica filler (Aerosil R805, available from Nippon Aerosil Co., Ltd.), 35 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), and 2 parts by mass of a silane coupling agent (KBM-403, available from Shin-Etsu Chemical Co., Ltd.) was prepared. This thermo-polymerizable composition was applied onto a PET film having a film thickness of 50 µm, and was dried for 5 minutes in an oven at 80° C. to make an adhesive layer having the thickness indicated in Table 1 (3 µm). This adhesive layer was pressed onto an electrically conductive particle holding surface of the transfer mold under conditions of 50° C. and 0.5 MPa to form a first electrically conductive particle group-containing layer onto which electrically conductive particles were transferred, and this layer was released from the transfer mold. Number density (particles/mm$^2$) of the electrically conductive particles contained in the first electrically conductive particle group-containing layer and a fluidity rank based on a melt viscosity value at 80° C. determined by the same approach as the approach described above are shown in Table 1.
Production of Anisotropic Conductive Film The anisotropic conductive film illustrated in FIG. 1 was produced by positioning the second electrically conductive particle group-containing layer opposite an electrically conductive particle transfer surface of the first electrically conductive particle group-containing layer, and bonding the layers together under conditions of 50° C. and 0.2 MPa.

Example 2: Production of Anisotropic Conductive Film of Multilayer Type Illustrated in FIG. 2

Formation of First Electrically Conductive Particle Group-Containing Layer

A first electrically conductive particle group-containing layer was made in the same manner as in Example 1 with the exception that a thermo-polymerizable composition was prepared from 40 parts by mass of a phenoxy resin (YP-50, available from Nippon Steel & Sumikin Chemical Co., Ltd.), 15 parts by mass of a silica filler (Aerosil R805, available from Nippon Aerosil Co., Ltd.), 40 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), and 2 parts by mass of a silane coupling agent (KBM-403, available from Shin-Etsu Chemical Co., Ltd.).
Formation of Second Electrically Conductive Particle Group-Containing Layer A second electrically conductive particle group-containing layer was made in the same manner as in Example 1.
Formation of Insulating Layer Containing No Electrically Conductive Particle A thermo-polymerizable composition containing 35 parts by mass of a phenoxy resin (YP-50, available from Nippon Steel & Sumikin Chemical Co., Ltd.), 5 parts by mass of a silica filler (Aerosil R805, available from Nippon Aerosil Co., Ltd.), 55 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), and 2 parts by mass of a silane coupling agent (KBM-403, available from Shin-Etsu Chemical Co., Ltd.) was prepared. This thermo-polymerizable composition was applied onto a PET film having a film thickness of 50 μm, and was dried for 5 minutes in an oven at 80° C. to make an insulating layer having the thickness indicated in Table 1 (7 μm).
Production of Anisotropic Conductive Film The anisotropic conductive film illustrated in FIG. 2 was produced by positioning the second electrically conductive particle group-containing layer and subsequently the insulating layer opposite an electrically conductive particle transfer surface of the first electrically conductive particle group-containing layer, and bonding the layers together under conditions of 50° C. and 0.2 MPa.

Example 3: Production of Anisotropic Conductive Film of Multilayer Type Illustrated in FIG. 3

Formation of First Electrically Conductive Particle Group-Containing Layer

A first electrically conductive particle group-containing layer was made in the same manner as in Example 1.
Formation of Second Electrically Conductive Particle Group-Containing Layer A thermo-polymerizable composition in which electrically conductive particles were dispersed was prepared by mixing 40 parts by mass of a phenoxy resin (YP-50, available from Nippon Steel & Sumikin Chemical Co., Ltd.), 15 parts by mass of a silica filler (Aerosil R805, available from Nippon Aerosil Co., Ltd.), 40 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), 2 parts by mass of a silane coupling agent (KBM-403, available from Shin-Etsu Chemical Co., Ltd.), and 5 parts by mass of electrically conductive particles (AUL703, available from Sekisui Chemical Co., Ltd., particle diameter: 3 μm). This thermo-polymerizable composition was applied onto a release PET film having a film thickness of 50 μm by using a bar coater to achieve the thickness indicated in Table 1 (5 μm), and was dried for 5 minutes in an oven at 80° C. to form a second electrically conductive particle group-containing layer in which electrically conductive particles were dispersed randomly on the PET film.
Formation of Insulating Layer Containing No Electrically Conductive Particle A thermo-polymerizable composition containing 40 parts by mass of a phenoxy resin (YP-50, available from Nippon Steel & Sumikin Chemical Co., Ltd.), 15 parts by mass of a silica filler (Aerosil R805, available from Nippon Aerosil Co., Ltd.), 40 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), and 2 parts by mass of a silane coupling agent (KBM-403, available from Shin-Etsu Chemical Co., Ltd.) was prepared. This thermo-polymerizable composition was applied onto a PET film having a film thickness of 50 μm, and was dried for 5 minutes in an oven at 80° C. to make an insulating layer having the thickness indicated in Table 1 (6 μm).
Production of Anisotropic Conductive Film The anisotropic conductive film illustrated in FIG. 3 was produced by positioning the insulating layer and subsequently the second electrically conductive particle group-containing layer opposite an electrically conductive particle transfer surface of the first electrically conductive particle group-containing layer, and bonding the layers together under conditions of 50° C. and 0.2 MPa.

Example 4: Production of Anisotropic Conductive Film of Multilayer Type Illustrated in FIG. 4

Formation of First Electrically Conductive Particle Group-Containing Layer

A first electrically conductive particle group-containing layer was made in the same manner as in Example 1.
Formation of Second Electrically Conductive Particle Group-Containing Layer A thermo-polymerizable composition in which electrically conductive particles were dispersed was prepared by mixing 35 parts by mass of a phenoxy resin (YP-50, available from Nippon Steel & Sumikin Chemical Co., Ltd.), 25 parts by mass of a silica filler (Aerosil R805, available from Nippon Aerosil Co., Ltd.), 35 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), 2 parts by mass of a silane coupling agent (KBM-403, available from Shin-Etsu Chemical Co., Ltd.), and 5 parts by mass of electrically conductive particles (AUL703, available from Sekisui Chemical Co., Ltd., particle diameter: 3 μm). This thermo-polymerizable composition was applied onto a release PET film having a film thickness of 50 μm by using a bar coater to achieve the thickness indicated in Table 1 (4 μm), and was dried for 5 minutes in an oven at 80° C. to form a second electrically conductive particle group-containing layer in which electrically conductive particles were dispersed randomly on the PET film.

Formation of Insulating Layer Containing No Electrically Conductive Particle

An insulating layer was made in the same manner as in Example 2.

Production of Anisotropic Conductive Film

The anisotropic conductive film illustrated in FIG. 4 was produced by positioning the first electrically conductive particle group-containing layer opposite the insulating layer from the non-electrically conductive particle transfer surface side, subsequently positioning the second electrically conductive particle group-containing layer opposite the insulating layer, and bonding the layers together under conditions of 50° C. and 0.2 MPa.

Example 5: Production of Anisotropic Conductive Film of Multilayer Type Illustrated in FIG. 5

Formation of First Electrically Conductive Particle Group-Containing Layer

A first electrically conductive particle group-containing layer was made in the same manner as in Example 1.

Formation of Second Electrically Conductive Particle Group-Containing Layer

A second electrically conductive particle group-containing layer was formed in the same manner as in Example 3 with the exception that the layer thickness was changed from 5 μm to 6 μm.

Formation of Third Electrically Conductive Particle Group-Containing Layer

A thermo-polymerizable composition in which electrically conductive particles were dispersed was prepared by mixing 40 parts by mass of a phenoxy resin (YP-50, available from Nippon Steel & Sumikin Chemical Co., Ltd.), 15 parts by mass of a silica filler (Aerosil R805, available from Nippon Aerosil Co., Ltd.), 40 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), 2 parts by mass of a silane coupling agent (KBM-403, available from Shin-Etsu Chemical Co., Ltd.), and 5 parts by mass of electrically conductive particles (AUL703, available from Sekisui Chemical Co., Ltd., particle diameter: 3 μm). This thermo-polymerizable composition was applied onto a release PET film having a film thickness of 50 μm by using a bar coater to achieve the thickness indicated in Table 1 (5 μm), and was dried for 5 minutes in an oven at 80° C. to form a third electrically conductive particle group-containing layer in which electrically conductive particles were dispersed randomly on the PET film.

Production of Anisotropic Conductive Film

The anisotropic conductive film illustrated in FIG. 5 was produced by positioning the second electrically conductive particle group-containing layer opposite one surface of the first electrically conductive particle group-containing layer, positioning the third electrically conductive particle group-containing layer opposite the other surface, and bonding the layers together under conditions of 50° C. and 0.2 MPa.

Comparative Example 1: Production of Anisotropic Conductive Film Illustrated in FIG. 6

Formation of Electrically Conductive Particle-Containing Layer

A thermo-polymerizable composition in which electrically conductive particles were dispersed was prepared by mixing 40 parts by mass of a phenoxy resin (YP-50, available from Nippon Steel & Sumikin Chemical Co., Ltd.), 15 parts by mass of a silica filler (Aerosil R805, available from Nippon Aerosil Co., Ltd.), 40 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), 2 parts by mass of a silane coupling agent (KBM-403, available from Shin-Etsu Chemical Co., Ltd.), and 30 parts by mass of electrically conductive particles (AUL703, available from Sekisui Chemical Co., Ltd., particle diameter: 3 μm). This thermo-polymerizable composition was applied onto a release PET film having a film thickness of 50 μm by using a bar coater to achieve the thickness indicated in Table 1 (6 μm), and was dried for 5 minutes in an oven at 80° C. to form an electrically conductive particle-containing layer in which electrically conductive particles were dispersed randomly on the PET film.

Formation of Insulating Layer

A thermo-polymerizable composition was prepared by mixing 35 parts by mass of a phenoxy resin (YP-50, available from Nippon Steel & Sumikin Chemical Co., Ltd.), 5 parts by mass of a silica filler (Aerosil R805, available from Nippon Aerosil Co., Ltd.), 55 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), and 2 parts by mass of a silane coupling agent (KBM-403, available from Shin-Etsu Chemical Co., Ltd.). This thermo-polymerizable composition was applied onto a release PET film having a film thickness of 50 μm by using a bar coater to achieve the thickness indicated in Table 1 (8 μm), and was dried for 5 minutes in an oven at 80° C. to form an insulating layer on the PET film.

Production of Anisotropic Conductive Film

Figure 6:
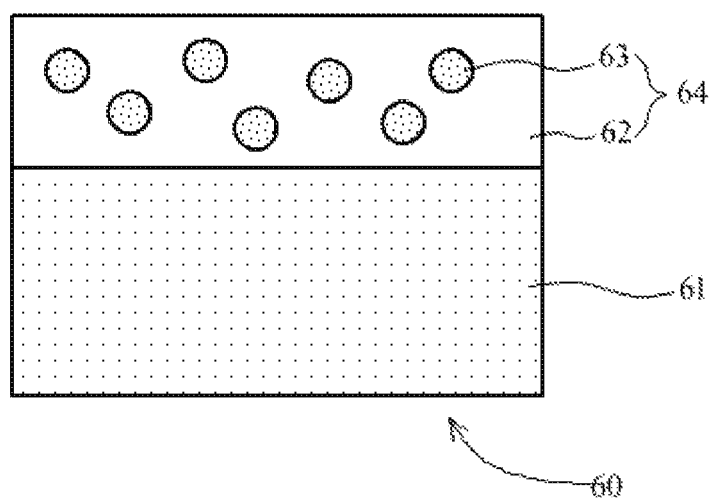
FIG. 6 is a cross-sectional view of a conventional anisotropic conductive film (Comparative Example 1).

The anisotropic conductive film illustrated in FIG. 6 was produced by positioning the electrically conductive particle-containing layer and the insulating layer opposite each other, and bonding the layers together under conditions of 50° C. and 0.2 MPa. Note that FIG. 6 illustrates an anisotropic conductive film 60, a thermosetting insulating resin layer 61, a thermosetting insulating binder 62, electrically conductive particles 63 and a thermosetting electrically conductive particle-containing layer 64.

Comparative Example 2: Production of Anisotropic Conductive Film Illustrated in FIG. 7

Formation of Electrically Conductive Particle-Containing Layer

A mold including a convexity arrangement pattern corresponding to a square lattice pattern was made, and known transparent resin pellets were melted, poured into the mold, and hardened by cooling to form a resin transfer mold including concavities with a square lattice pattern of the density shown in Table 1 (corresponding to the number density of the electrically conductive particles). The concavities of this transfer mold were filled with electrically conductive particles (AUL703, available from Sekisui Chemical Co., Ltd., particle diameter: 3 μm).

Separately, a photopolymerizable composition containing 65 parts by mass of a phenoxy resin (YP-50, available from Nippon Steel & Sumikin Chemical Co., Ltd.), 5 parts by mass of a silica filler (Aerosil R805, available from Nippon Aerosil Co., Ltd.), 25 parts by mass of a (meth)acrylic compound (A-LEN-10, available from Shin-Nakamura Chemical Co., Ltd.), 3 parts by mass of a photoradical polymerization initiator (IRGACURE 369, available from BASF Japan LTD.), and 2 parts by mass of a silane coupling agent (KBM-403, available from Shin-Etsu Chemical Co., Ltd.) was prepared. This photopolymerizable composition was applied onto a PET film having a film thickness of 50 μm, and was dried for 5 minutes in an oven at 80° C. to make an adhesive layer having the thickness indicated in Table 1 (3 μm). This adhesive layer was pressed onto an electrically conductive particle holding surface of the transfer mold under conditions of 50° C. and 0.5 MPa to form an electrically conductive particle-containing layer onto which electrically conductive particles were transferred, and this layer was released from the transfer mold. Note that the measurement of melt viscosity of this electrically conductive particle-containing layer was failed because the fluidity was too low.

Formation of Insulating Layer

A thermo-polymerizable composition was prepared by mixing 35 parts by mass of a phenoxy resin (YP-50, available from Nippon Steel & Sumikin Chemical Co., Ltd.), 5 parts by mass of a silica filler (Aerosil R805, available from Nippon Aerosil Co., Ltd.), 55 parts by mass of a liquid epoxy resin (jER828, available from Mitsubishi Chemical Corporation), 3 parts by mass of a thermal cationic polymerization initiator (SI-60L, available from Sanshin Chemical Industry Co., Ltd.), and 2 parts by mass of a silane coupling agent (KBM-403, available from Shin-Etsu Chemical Co., Ltd.). This thermo-polymerizable composition was applied onto a release PET film having a film thickness of 50 μm by using a bar coater to achieve the thickness indicated in Table 1 (11 μm), and was dried for 5 minutes in an oven at 80° C. to form an insulating layer on the PET film.

Production of Anisotropic Conductive Film

Figure 7:
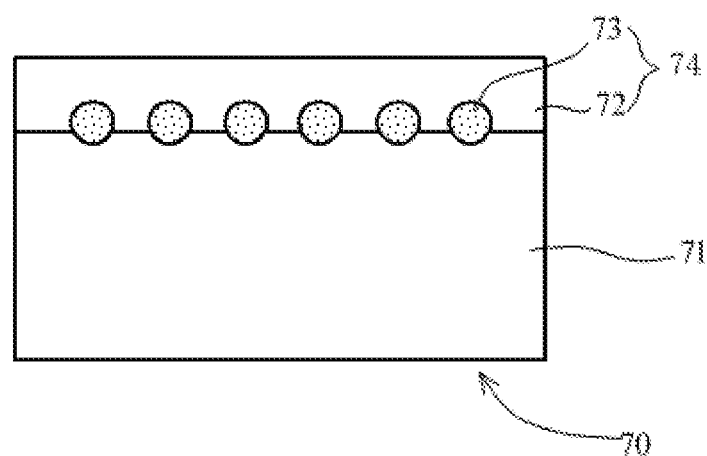
FIG. 7 is a cross-sectional view of an anisotropic conductive film of Comparative Example 2.

The anisotropic conductive film illustrated in FIG. 7 was produced by positioning the electrically conductive particle-containing layer and the insulating layer opposite each other, bonding the layers together under conditions of 50° C. and 0.2 MPa, and irradiating the film with a UV ray having a wavelength of 365 nm and cumulative radiation of 4000 mJ/cm$^2$. Note that FIG. 7 illustrates an anisotropic conductive film 70, an insulating resin layer 71, a photocurable insulating binder 72, electrically conductive particles 73, and a photocurable electrically conductive particle-containing layer 74.

Evaluation

For evaluation of the anisotropic conductive films of Examples 1 to 5 and Comparative Examples 1 and 2, connection structures for evaluation were each made by anisotropically conductively connecting the following IC for evaluation and the following glass substrate by thermocompression bonding connection under the following conditions (the UV irradiation described below was used in combination for Comparative Example 2).

Evaluation IC: outer size=1.8 mm×20 mm×0.2 mm, gold bump specifications=15 μm (height)×15 μm (width)×100 μm (length) (gap between bumps: 15 μm)

Glass substrate with ITO coated wiring: outer size=30 mm×50 mm×0.5 mm

Thermocompression bonding connection: thermocompression bonding for 5 seconds at 150° C. and 80 MPa from the IC chip side.

UV irradiation connection: thermocompression bonding for 5 seconds at 100° C. and 80 MPa, and in 4 seconds after the initiation of thermocompression bonding, irradiation with an i-ray from a UV irradiation device (ZUV-C30H, available from Omron Corporation).

The connection structures for evaluation thus made were evaluated as described below with regard to (a) initial conductivity, (b) conduction reliability, (c) a short circuit occurrence rate, and (d) particle capturing capability. The obtained results are shown in Table 1.

(a) Initial Conductivity

A value of conduction resistance of the obtained connection structure for evaluation when a current of 2 mA was applied by a 4-terminal method with use of a digital multimeter was measured and evaluated under the following criteria.

Evaluation Criteria

OK (favorable): the case where the measured resistance value is less than 1Ω

NG (poor): the case where the measured resistance value is not less than 1Ω

(b) Conduction Reliability

Conduction resistance after placement of the obtained connection structure for evaluation in a thermostatic chamber set to a temperature of 85° C. and humidity of 85% RH for 500 hours was measured in the same manner as in the case of the initial conductivity, and was evaluated under the following criteria.

Evaluation Criteria

OK (favorable): the case where the measured resistance value is less than 5Ω

NG (poor): the case where the measured resistance value is not less than 5Ω

(c) Short Circuit Occurrence Rate

When the connection structure was made, the IC for evaluation was changed to the following IC (comb-shaped TEG (test element group), space: 7.5 μm). A short circuit occurrence rate of the obtained connection structure was measured by using a digital multimeter, and was evaluated under the following criteria.

Outer size: 1.5 mm×13 mm

Thickness: 0.5 mm

Bump specifications: gold plating; height: 15 μm; size: 25 μm×140 μm; gap between bumps: 7.5 μm Evaluation Criteria OK (favorable): the case where the short circuit occurrence rate is less than 50 ppm NG (poor) the case where the short circuit occurrence rate is not less than 50 ppm (d) Particle Capturing Capability The IC for evaluation and the glass substrate were connected to each other under the same conditions as in the cases of the initial conductivity and the conduction reliability with the exception that a bump size of the IC used for connection was changed to 11 μm×95 μm. Terminals after connection were observed from the glass substrate side by using a metallurgical microscope, and particle capturing capability was determined by counting the number of indentations. The number of bumps observed was N=300, and was evaluated for bumps exhibiting the smallest number of captures (number of indentations). The determination criteria are as follows.

Evaluation Criteria

A (excellent): not less than 10 indentations
B (favorable): not less than 5 indentations and less than 10 indentations
C (normal): not less than 3 indentations and less than 5 indentations
D (poor): less than 3 indentations it was necessary to photocure the film to suppress the fluidity of the electrically conductive particle-containing layer. Therefore, the conduction reliability resulted in an NG evaluation.

INDUSTRIAL APPLICABILITY

The anisotropic conductive film of the present invention is useful for anisotropic conductive connection of an electronic component such as an IC chip to a wiring substrate. Wiring for electronic components has become increasingly narrow, and the present invention is particularly useful for anisotropic conductive connection of narrow electronic components.

REFERENCE SIGNS LIST

1 Insulating binder
2 Electrically conductive particle
10 First electrically conductive particle group

TABLE 1

| | | Comparative Example | | Example | | | | |
|---|---|---|---|---|---|---|---|---|
| | | 1 | 2 | 1 | 2 | 3 | 4 | 5 |
| Corresponding drawing numbers | | 6 | 7 | 1 | 2 | 3 | 4 | 5 |
| First electrically conductive particle group-containing layer | Number density (particles/mm²) | 60000 | 30000 | 20000 | 20000 | 20000 | 20000 | 20000 |
| | Plan view | Random | Square lattice | Square lattice | Square lattice | Square lattice | Square lattice | Square lattice |
| | Melt viscosity | B | Measurement failed | A | B | A | A | A |
| | Layer thickness (μm) | 6 | 3 | 3 | 3 | 3 | 3 | 3 |
| Second electrically conductive particle group-containing layer | Number density (particles/mm²) | | | 4000 | 4000 | 4000 | 4000 | 4000 |
| | Plan view | | | Random | Random | Random | Random | Random |
| | Melt viscosity | | | C | C | B | A | B |
| | Layer thickness (μm) | | | 4 | 4 | 5 | 4 | 6 |
| Third electrically conductive particle group-containing layer | Number density (particles/mm²) | | | | | | | 4000 |
| | Plan view | | | | | | | Random |
| | Melt viscosity | | | | | | | B |
| | Layer thickness (μm) | | | | | | | 5 |
| Insulating layer | Melt viscosity | D | D | | D | B | D | |
| | Layer thickness (μm) | 8 | 11 | | 7 | 6 | 7 | |
| Evaluation | Initial conductivity | OK | OK | OK | OK | OK | OK | OK |
| | Conduction reliability | OK | NG | OK | OK | OK | OK | OK |
| | Short circuit occurrence rate | NG | OK | OK | OK | OK | OK | OK |
| | Particle capturing capability | D | B | A | A | A | A | A |

As can be seen from Table 1, the anisotropic conductive films of Examples 1 to 5 exhibited favorable results for all of the evaluation items. Note that in the case of the anisotropic conductive film of Example 4, since the fluidity rank of the melt viscosity at 80° C. resulted in an A evaluation for both the first electrically conductive particle group-containing layer and the second electrically conductive particle group-containing layer, the value of the initial conductivity or the conduction reliability tended to be high for both the layers, but the level was not problematic for practical use.

In contrast, in the case of the anisotropic conductive film of Comparative Example 1, since the electrically conductive particle-containing layer was not constituted as two layers, it was necessary to increase the number density of the electrically conductive particles of the electrically conductive particle-containing layer to secure the initial conductivity and the conduction reliability. As a result, the short circuit occurrence rate resulted in an NG evaluation, and the particle capturing capability resulted in a D evaluation. In addition, in the case of the anisotropic conductive film of Comparative Example 2, since the electrically conductive particle-containing layer was not constituted as two layers, 20 Second electrically conductive particle group
30 Third electrically conductive particle group
60, 70, 100, 200, 300, 400, 500 Anisotropic conductive film
61, 71 Insulating resin layer
62, 72 Insulating binder
63, 73 Electrically conductive particle
64, 74 Electrically conductive particle-containing layer
R1 First region
R2 Second region
R3 Third region
R4 Fourth region

The invention claimed is:

1. An anisotropic conductive film having a first electrically conductive particle group-containing layer containing a first electrically conductive particle group and a second electrically conductive particle group-containing layer containing a second electrically conductive particle group, each group comprising a plurality of electrically conductive particles, in an insulating binder;
    wherein the first electrically conductive particle group and the second electrically conductive particle group are present in a first region that is in the first electrically conductive particle group-containing layer and a second region that is in the second electrically conductive particle group-containing layer, respectively, which differ from each other in a thickness direction of the anisotropic conductive film and are parallel to a plane direction;

the second electrically conductive particle group-containing layer is laminated on the first electrically conductive particle group-containing layer, the insulating binder of each of the first and second electrically conductive particle group-containing layers contains a polymerizable composition, the first electrically conductive particle group and the second electrically conductive particle group differ from each other in an existence state of the electrically conductive particles, the respective electrically conductive particles constituting the second electrically conductive particle group exist being dispersed in the second region, and the respective electrically conductive particles constituting the first electrically conductive particle group are arranged regularly wherein the respective electrically conductive particles constituting the first electrically conductive particle group are arranged regularly in a lattice form, the respective electrically conductive particles constituting the first electrically conductive particle group have a number density in the range of from 10000 to 30000 particles/mm$^2$, the respective electrically conductive particles constituting the second electrically conductive particle group are randomly dispersed in the second region, and the respective electrically conductive particles constituting the second electrically conductive particle group have a number density in the range of from 2000 to 10000 particles/mm$^2$.

2. The anisotropic conductive film according to claim 1, wherein the respective electrically conductive particles constituting the first electrically conductive particle group exist at roughly the same distance from a surface of the anisotropic conductive film in the first region.

3. The anisotropic conductive film according to claim 2, wherein the respective electrically conductive particles constituting the first electrically conductive particle group exist independently of one another in a plan view of the anisotropic conductive film.

4. The anisotropic conductive film according to claim 1, further comprising a third region differing from the first region and the second region in the thickness direction of the anisotropic conductive film, being parallel to the plane direction and containing no electrically conductive particle.

5. The anisotropic conductive film according to claim 4, wherein the first region, the second region and the third region are disposed in this order.

6. The anisotropic conductive film according to claim 4, wherein the first region, the third region and the second region are disposed in this order.

7. The anisotropic conductive film according to claim 4, wherein the second region, the first region and the third region are disposed in this order.

8. The anisotropic conductive film according to claim 1, wherein
a third electrically conductive particle group comprising a plurality of electrically conductive particles is further contained in the insulating binder; and
the third electrically conductive particle group is present in a fourth region differing from the first region and the second region in the thickness direction of the anisotropic conductive film and being parallel to the plane direction.

9. The anisotropic conductive film according to claim 8, wherein the fourth region, the first region and the second region are disposed in this order.

10. The anisotropic conductive film according to claim 1, wherein
the number density of the electrically conductive particles in the first electrically conductive particle group is the same as the number density of the electrically conductive particles in the second electrically conductive particle group.

11. The anisotropic conductive film according to claim 1, wherein
the number density of the electrically conductive particles in the first electrically conductive particle group is 3 to 5 times the number density of the electrically conductive particles in the second electrically conductive particle group.

12. A connection structure comprising:
the anisotropic conductive film according to claim 1;
a first electronic component; and
a second electronic component;
wherein the first electronic component is anisotropically conductively connected to the second electronic component by using the anisotropic conductive film.

13. A method for manufacturing a connection structure comprising:
connecting a first electronic component to a second electronic component by anisotropic conductive connection using the anisotropic conductive film according to claim 1.

* * * * *